US011076487B2

(12) United States Patent
Hwang et al.

(10) Patent No.: US 11,076,487 B2
(45) Date of Patent: Jul. 27, 2021

(54) ELECTRONIC COMPONENT EMBEDDED SUBSTRATE

(71) Applicant: SAMSUNG ELECTRO-MECHANICS CO., LTD., Suwon-si (KR)

(72) Inventors: Mi Sun Hwang, Suwon-si (KR); Deok Man Kang, Suwon-si (KR); Jun Hyeong Jang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/820,172

(22) Filed: Mar. 16, 2020

(65) Prior Publication Data
US 2021/0185819 A1 Jun. 17, 2021

(30) Foreign Application Priority Data
Dec. 16, 2019 (KR) .......................... 10-2019-0167949

(51) Int. Cl.
*H05K 1/18* (2006.01)
(52) U.S. Cl.
CPC ..................................... *H05K 1/182* (2013.01)
(58) Field of Classification Search
CPC ............................................. H05K 1/182–185
USPC ......................................................... 361/761
See application file for complete search history.

(56) References Cited

U.S. PATENT DOCUMENTS

| 2012/0227261 | A1* | 9/2012 | Inui | H05K 1/0206 29/849 |
|---|---|---|---|---|
| 2013/0284506 | A1* | 10/2013 | Zanma | H05K 1/185 174/260 |
| 2013/0299223 | A1* | 11/2013 | Yoo | H05K 1/02 174/259 |
| 2015/0327362 | A1* | 11/2015 | Maeda | H05K 3/4647 361/761 |
| 2016/0118325 | A1* | 4/2016 | Wang | H05K 1/188 257/774 |
| 2016/0233167 | A1* | 8/2016 | Shimizu | H01L 21/4857 |
| 2017/0094797 | A1* | 3/2017 | Baek | H05K 1/185 |
| 2018/0063965 | A1* | 3/2018 | Leitgeb | H05K 1/0203 |
| 2020/0359500 | A1* | 11/2020 | Tanaka | H05K 1/183 |

FOREIGN PATENT DOCUMENTS

KR 10-1304359 B1 9/2013

\* cited by examiner

*Primary Examiner* — Hoa C Nguyen
(74) *Attorney, Agent, or Firm* — Morgan, Lewis & Bockius LLP

(57) ABSTRACT

An electronic component embedded substrate includes a core structure including a first insulating body and core wiring layers and having a cavity and a stopper layer. An electronic component is disposed in the cavity. The stopper layer includes a first metal layer embedded in the first insulating body and having a portion of an inner surface exposed from the first insulating body, and a second metal layer disposed below the first metal layer and having at least a portion of an upper surface disposed as a bottom surface of the cavity. The cavity has an inner surface of the first metal layer and an inner surface of the first insulating body as a first wall surface and a second wall surface, respectively, and an inclination of the first wall surface is different from an inclination of the second wall surface.

20 Claims, 9 Drawing Sheets

ELECTRONIC COMPONENT EMBEDDED SUBSTRATE

CROSS-REFERENCE TO RELATED APPLICATION(S)

This application claims benefit of priority to Korean Patent Application No. 10-2019-0167949 filed on Dec. 16, 2019 in the Korean Intellectual Property Office, the disclosure of which is incorporated herein by reference in its entirety.

BACKGROUND

1. Field

The present disclosure relates to an electronic component embedded substrate.

2. Description of Related Art

Recently, with the advent of the 5G era, the number of components to be mounted on a motherboard of a smartphone is increasing. In addition, it is necessary to secure space for additionally mounting components such as an antenna and a baseband modem for 5G communications on the motherboard while maintaining compatibility with existing 4G LTE communications. Therefore, in addition to the miniaturization of each component, miniaturization is being considered by modularizing existing components in the form of a system in package (SiP).

SUMMARY

An aspect of the present disclosure may provide an electronic component embedded substrate in which a coverage area for embedding an electronic component may be reduced.

Another aspect of the present disclosure may provide an electronic component embedded substrate that may be modularized and miniaturized in a form of a SiP.

One of several solutions suggested in the present disclosure may be to control an inclination of a wall surface of a cavity using a plurality of layers of metal layers as a stopper layer provided for forming a cavity, thereby acting as a multi-stage stopper.

According to an aspect of the present disclosure, an electronic component embedded substrate may include a core structure including a first insulating body and a plurality of core wiring layers respectively disposed on or in the first insulating body, the core structure having a cavity penetrating through at least a portion of the first insulating body in a thickness direction and having a stopper layer disposed on a lower side of the cavity. An electronic component is disposed in the cavity and attached to the stopper layer. The stopper layer includes a first metal layer embedded in the first insulating body and having at least a portion of an inner surface exposed from the first insulating body, and a second metal layer disposed below the first metal layer and having at least a portion of an upper surface disposed as a bottom surface of the cavity to which the electronic component is attached. The cavity has the inner surface of the first metal layer and an inner surface of the first insulating body as a first wall surface and a second wall surface, respectively, and an inclination of the first wall surface and an inclination of the second wall surface are different from each other.

Another one of several solutions suggested in the present disclosure may be to introduce a modularized structure by disposing a surface mounted component on an electronic component embedded substrate.

For example, one or more surface mounted components may be mounted on the electronic component embedded substrate according to an example described above through the electrical connection metal bumps.

According to another aspect of the present disclosure, an electronic component embedded substrate includes a core structure including a first insulating body and a plurality of core wiring layers respectively disposed on or in the first insulating body, the core structure having a cavity penetrating through at least a portion of the first insulating body in a thickness direction and having a stopper layer disposed on a lower side of the cavity. The stopper layer includes first and second metal layers including different metal materials and overlapping each other in the thickness direction, the cavity penetrates through the first metal layer, and the cavity has the second metal layer integrally extending across a lower surface thereof. A side wall surface of the first metal layer forms part of a side wall of the cavity, and an inclination of the side wall surface of the first metal layer is non-orthogonal to the lower surface of the cavity.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
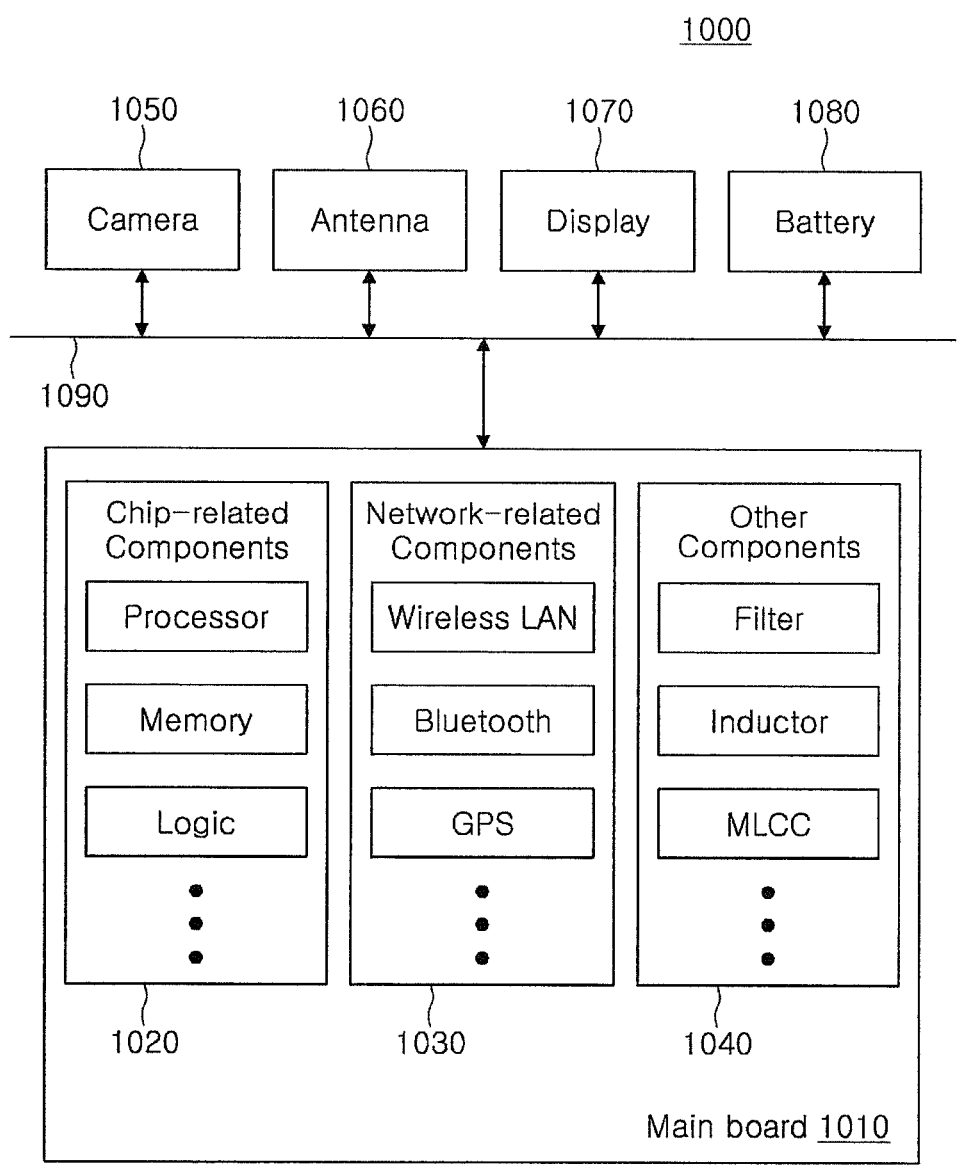
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related electronic components. In addition, the chip related components 1020 may be combined with each other. The chip related components 1020 may be in the form of a package including the above-described chip or electronic component.

The network related components 1030 may include components compatible with and/or implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include components compatible with and/or implementing a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components in the form of a chip component used for various other purposes, and the like. In addition, other components 1040 may be combined with the chip related components 1020 and/or the network related components 1030 described above.

Depending on a type of the electronic device 1000, the electronic device 1000 may include other electronic components that may or may not be physically and/or electrically connected to the main board 1010. Examples of other electronic components may include a camera module 1050, an antenna module 1060, a display 1070, a battery 1080, and the like. However, other electronic components are not limited thereto, and may also include an audio codec, a video codec, a power amplifier, a compass, an accelerometer, a gyroscope, a speaker, a mass storage device (e.g., a hard disk drive), a compact disk (CD), a digital versatile disk (DVD), and the like. In addition, other electronic components used for various purposes may be included according to the type of the electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, and may be any other electronic device that processes data.

Figure 2:
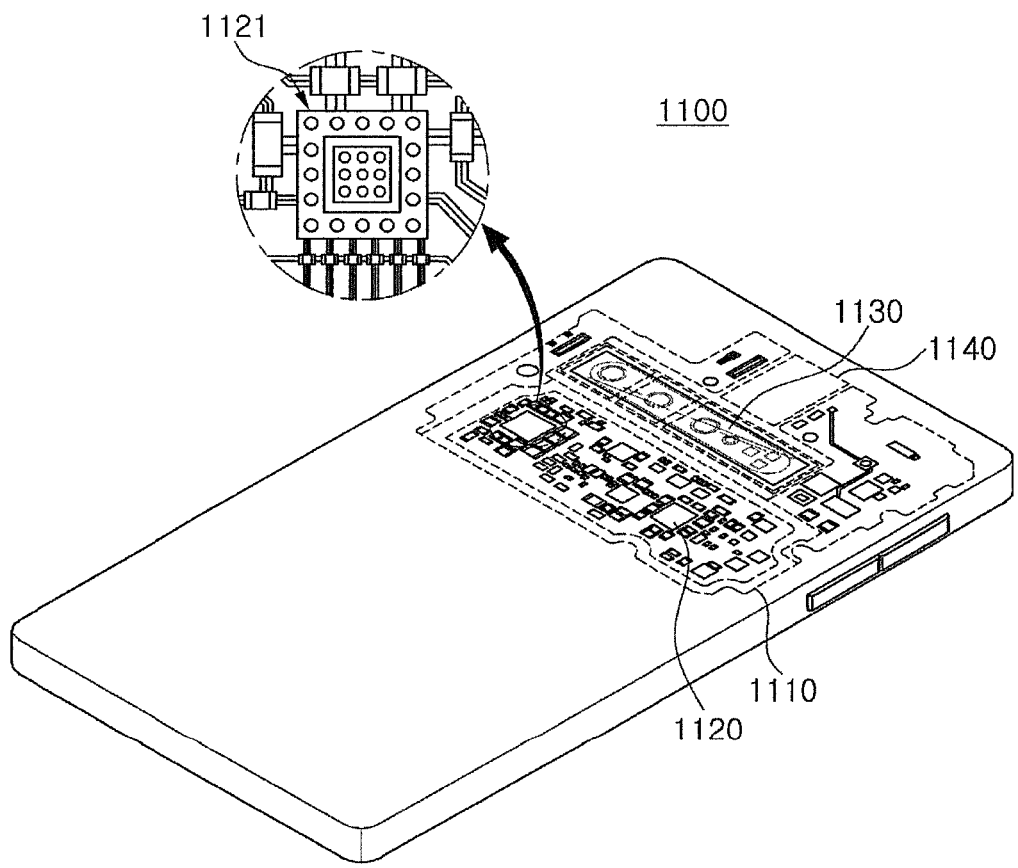
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A main board 1110 may be accommodated in the smartphone 1100, and various electronic components 1120 may be physically and/or electrically connected to the main board 1110. In addition, other electronic components that may or may not be physically and/or electrically connected to the main board 1110, such as the camera module 1130 and/or the speaker 1140, may be accommodated in the smartphone 1100. Some of the electronic components 1120 may be the chip related components described above, for example, a semiconductor package 1121, but are not limited thereto. The semiconductor package 1121 may be in a form in which the electronic component is embedded in a multilayer printed circuit board and/or a form in which the electronic component is surface mounted on the multilayer printed circuit board, but is not limited thereto. On the other hand, the electronic device is not necessarily limited to the smartphone 1100, but may be other electronic devices as described above.

Figure 3:
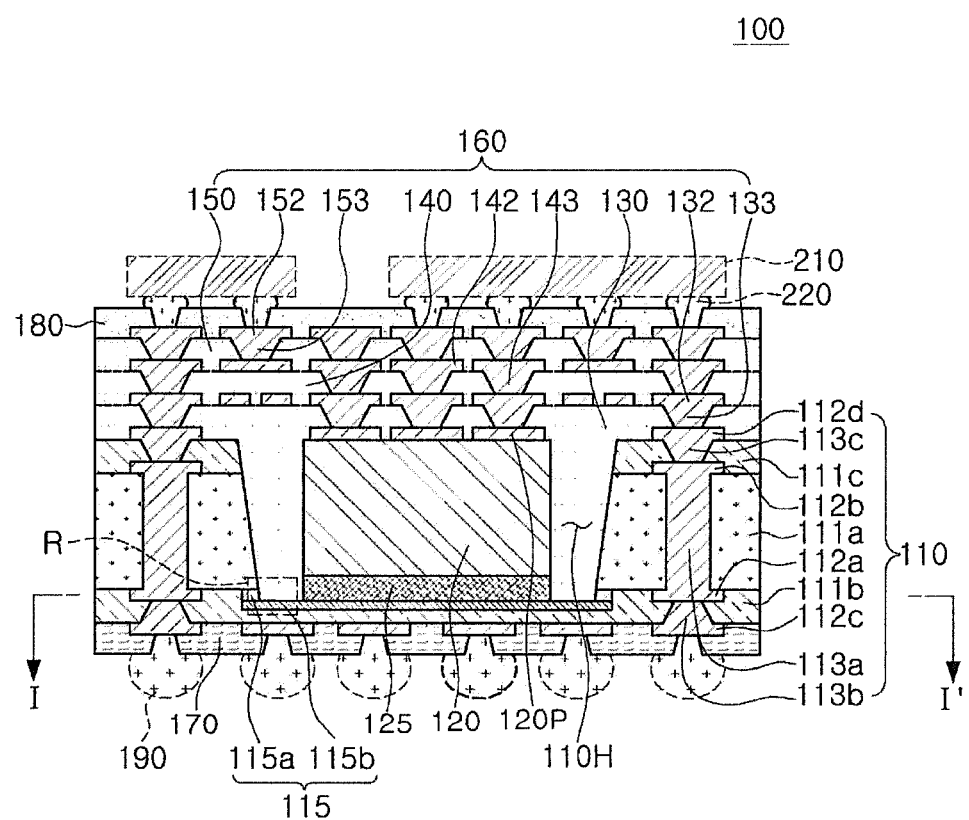
FIG. 3 is a schematic cross-sectional view illustrating an example of an electronic component embedded substrate.

FIG. 3 is a schematic cross-sectional view illustrating an example of an electronic component embedded substrate.

Figure 4:
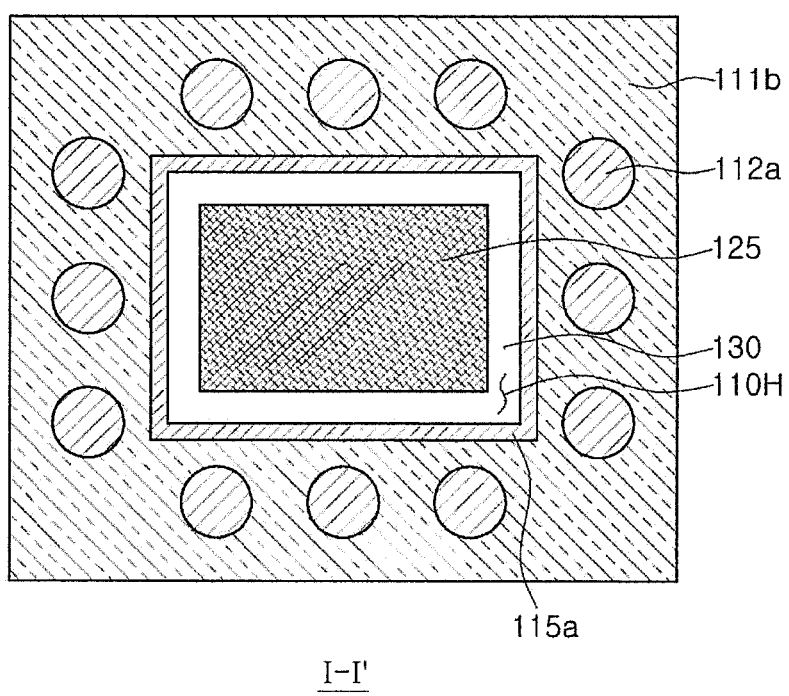
FIG. 4 is a schematic cut plan view of the electronic component embedded substrate taken along line I-I' of FIG. 3.

FIG. 4 is a schematic cut plan view of the electronic component embedded substrate taken along line I-I' of FIG. 3.

Figure 5:
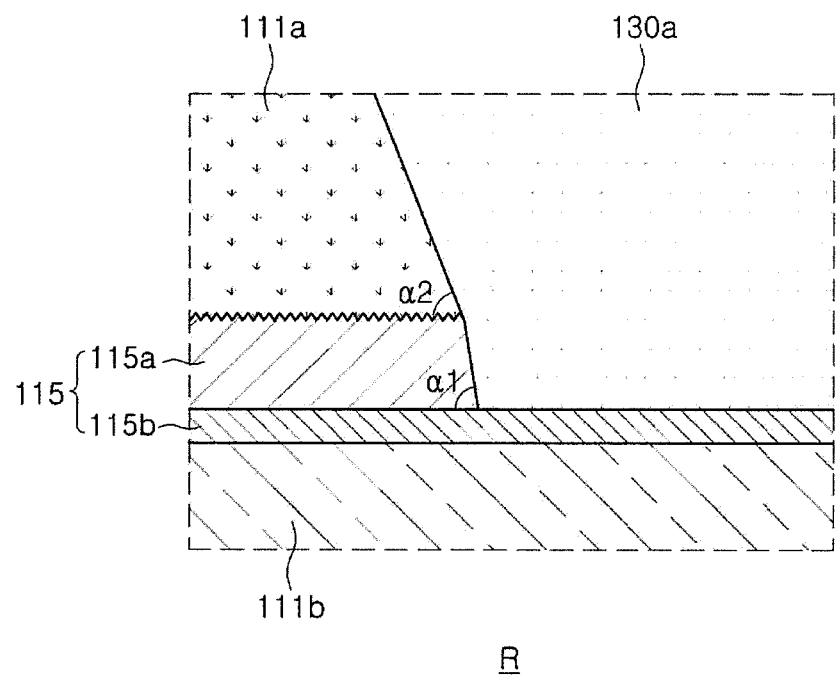
FIG. 5 is a schematic enlarged cross-sectional view of region R of the electronic component embedded substrate of FIG. 3.

FIG. 5 is a schematic enlarged cross-sectional view of region R of the electronic component embedded substrate of FIG. 3.

Figure 6:
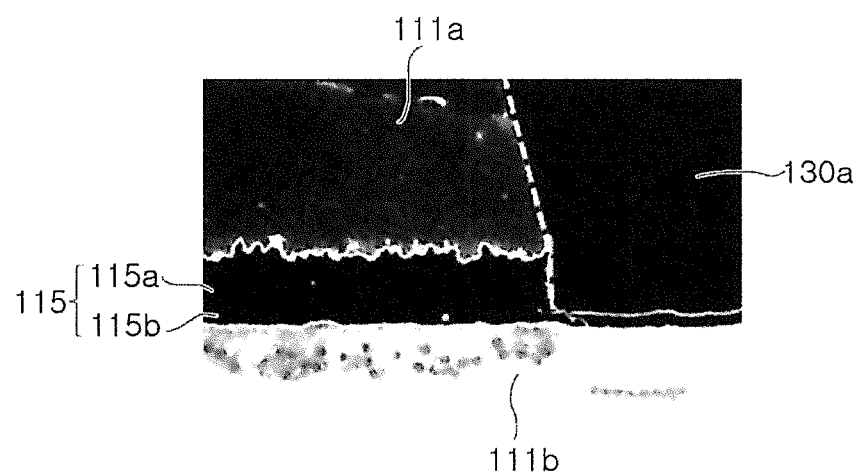
FIG. 6 is an enlarged cross-sectional photograph of the R region of the electronic component embedded substrate of FIG. 3 when viewed with an electron microscope.

FIG. 6 is a schematic enlarged cross-sectional photograph of the R region of the electronic component embedded substrate of FIG. 3 when viewed with an electron microscope.

Figure 7:
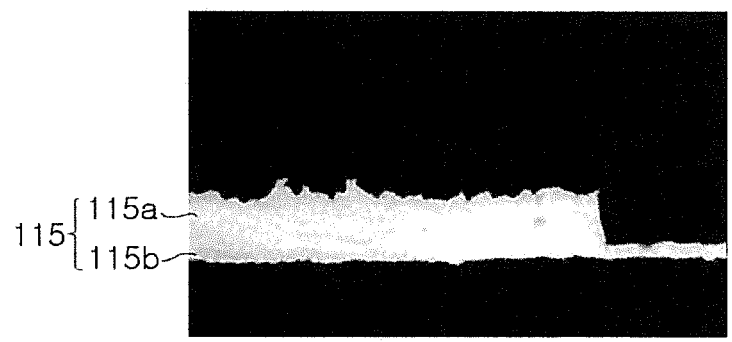
FIG. 7 is an enlarged cross-sectional photograph of the R region of the electronic component embedded substrate of FIG. 3 when viewed with an electron microscope emphasizing a metal layer.

FIG. 7 is a schematic enlarged cross-sectional photograph of the R region of the electronic component embedded substrate of FIG. 3 when viewed with an electron microscope emphasizing a metal layer.

Referring to the drawings, an electronic component embedded substrate 100 according to an example may include a core structure 110, an electronic component 120, a build-up structure 160, a first passivation layer 170, and a second passivation layer 180. The core structure 110 may have a cavity 110H penetrating through portions 111*a* and 111*c* of the first insulating bodies 111*a*, 111*b*, and 111*c* in a thickness direction. A stopper layer 115 may be disposed as a bottom surface on a lower side of the cavity 110H. The stopper layer 115 may include a plurality of metal layers 115*a* and 115*b*. For example, the stopper layer 115 may include a first metal layer 115*a* embedded in the first insulating bodies 111*a*, 111*b*, and 111*c* and in which at least a portion of an inner surface is exposed from the first insulating bodies 111*a*, 111*b*, and 111*c*, and a second metal layer 115*b* disposed below the first metal layer 115*a* and in which at least a portion of an upper surface is provided as the bottom surface of the cavity 110H to which the electronic component 120 is attached. The first and second metal layers 115*a* and 115*b* may function as two-stage stoppers in the process of forming the cavity 110H. Therefore, a first wall surface of the cavity 110H provided by the inner surface of the first metal layer 115a and a second wall surface of the cavity 110H provided by the inner surface of the first insulating bodies 111a, 111b, and 111c may have different inclinations α1 and α2. For example, the inclinational of the first wall surface may be greater than the inclination α2 of the second wall surface. Moreover, the inclinational of the first wall surface and the inclination α2 of the second wall surface may be non-orthogonal to a bottom surface of the cavity 110H.

Meanwhile, as described above, development of technology for embedding the active components and/or the passive components in the substrate has recently increased. In a structure of such an electronic component embedded substrate, a warpage control may be relatively easy in a symmetric structure compared with an asymmetric structure. However, the asymmetric structure is used to provide a reduced thickness of the structure by eliminating unnecessary layers. Meanwhile, in order to embed and bury the electronic component in the substrate of the asymmetric structure, a cavity is generally formed in a form of a blind. In order to form such a cavity, laser processing or blast processing may be considered. In this case, a stopper layer formed of a metal material may be used to adjust a processing depth. In the case of the blind cavity, a difference between a top size and a bottom size may occur as a result of processing, commonly referred to as a foot. Since a large foot size is a factor that inhibits the reduction of a package area, the reduction of the foot size becomes important.

On the other hand, in the electronic component embedded substrate 100 according to an example, the stopper layer 115 providing the bottom surface to form the cavity 110H may include the plurality of metal layers 115a and 115b, and may perform a multi-stage stopper function as can be seen in the process described later. As a result, the inclinations α1 and α2 of the wall surface of the cavity 110H may be controlled. For example, the first wall surface provided by the inner surface of the first metal layer 115a of the cavity 110H and the second wall surface provided by the inner surface of the first insulating bodies 111a, 111b, and/or 111c of the cavity 110H may have different inclinations α1 and α2, respectively. For example, the inclination α1 of the first wall surface may be greater than the inclination α2 of the second wall surface. For example, the inclination α1 of the first wall surface may be close to vertical at approximately 85° or more, and the inclination α2 of the second wall surface may be approximately 75° or more, smaller than the inclination α1 of the first wall surface, but may be greater than that of a general blind cavity. Moreover, the inclinations α1 and α2 of the wall surface of the cavity 110H may be non-orthogonal to the bottom surface of the cavity 110H. Here, the inclinations α1 and α2 of the first and second wall surfaces may be determined by an angle formed by a bottom surface not exposed to the cavity 110H, that is, the bottom surface in the first insulating bodies 111a, 111b and 111c and the wall surface. Since the inclination α1 of the first wall surface is greater than the inclination α2 of the second wall surface, the foot may be effectively reduced, and as a result, the package size may also be reduced. Since the inclination α2 of the second wall surface is smaller than the inclination α1 of the first wall surface, but greater than that of the general blind cavity, it may be easy to dispose the electronic component 120 in the cavity 110H without significantly inhibiting the above-described foot reduction and package reduction effects, and the efficiency of the process of disposing and embedding the electronic component 120 may also be improved.

Meanwhile, the first and second metal layers 115a and 115b may include different metal materials. For example, the metal materials of the first and second metal layers 115a and 115b may be selectively removed by different etching solutions. In this regard, the first metal layer 115a may include copper (Cu), and the second metal layer 115b may include nickel (Ni). However, the metal materials are not limited thereto, and in addition to the combination of copper (Cu)/nickel (Ni), as long as it is a combination of metals having different etching rates, that is, a combination that may be selectively removed by different etching solutions, a combination of other metal materials may be used. In the case of using the metal material of such a combination, the foot may be easily removed because the cavity 110H may be processed in multiple ways as in a process described later. Therefore, the inclinations α1 and α2 of the wall surface of the cavity 110H as described above may be more easily controlled.

Meanwhile, an upper surface of the first metal layer 115a that contacts the first insulating bodies 111a, 111b, and/or 111c may have a greater surface roughness than a lower surface of the first metal layer 115a that contacts the second metal layer 115b. The surface roughness may be, for example, a center line average roughness Ra and/or a ten point average roughness Rz. Thereby, adhesion of heterogeneous materials between the first metal layer 115a and the first insulating bodies 111a, 111b, and/or 111c may be improved, and a problem in reliability such as interface delamination or the like may be solved.

Meanwhile, the stopper layer 115 may have a central region including the second metal layer 115b and exposed from the first insulating bodies 111a, 111b, and 111c by the cavity 110H, and an edge region including the first and second metal layers 115a and 115b and embedded in the first insulating bodies 111a, 111b, and 111c. In this case, a thickness of the stopper layer 115 in the central region may be thinner than the thickness of the stopper layer 115 in the edge region. This is because the first metal layer 115a in the central region may be removed by etching in the manufacturing process.

Hereinafter, respective components included in the electronic component embedded substrate 100 according to an example will be described in more detail with reference to the drawings.

The core structure 110 may include the first core insulating layer 111a, a first core wiring layer 112a and a stopper layer 115 both disposed on a lower surface of the first core insulating layer 111a, a second core wiring layer 112b disposed on an upper surface of the first core insulating layer 111a, a second core insulating layer 111b disposed on the lower surface of the first core insulating layer 111a and covering at least a portion of each of the first core wiring layer 112a and the stopper layer 115, a third core wiring layer 112c disposed on a lower surface of the second core insulating layer 111b, a third core insulating layer 111c disposed on the upper surface of the first core insulating layer 111a and covering at least a portion of the second core wiring layer 112b, and a fourth core wiring layer 112d disposed on an upper surface of the third core insulating layer 111c. The core structure 110 may further include a first core via layer 113a penetrating through the first core insulating layer 111a and connecting the first and second core wiring layers 112a and 112b to each other, a second core via layer 113b penetrating through the second core insulating layer 111b and connecting the first and third core wiring layers 112a and 112c to each other, and a third core via layer 113c penetrating through the third core insulating layer 111c and connecting the second and fourth core wiring layers 112b and 112d to each other.

The core structure 110 may further improve rigidity of the electronic component embedded substrate 100 depending on certain materials, and serve to secure uniformity of a thickness of the first build-up insulating layer 130. In addition, the core structure 110 may include the first to fourth core wiring layers 112a, 112b, 112c, and 112d and the first to third core via layers 113a, 113b, and 113c, that design various circuits, and also provide upper and lower electrical connection paths. In addition, the core structure 110 may include the third core wiring layer 112c disposed below a back surface of the electronic component 120, and thus, may easily provide a backside wiring layer. The core structure 110 may be configured with more layers than those illustrated in the drawing. Meanwhile, the number of core wiring layers 112a, 112b, 112c, and 112d of the core structure 110 may be greater than the number of build-up wiring layers 132, 142, and 152 of a build-up structure 160.

The core structure 110 may have the cavity 110H. The stopper layer 115 may be disposed as a bottom surface of the cavity 110H. The cavity 110H may be in the form of a blind that penetrates through the first core insulating layer 111a and the third core insulating layer 111b, but does not penetrate through the second core insulating layer 111b. The cavity 110H may have a tapered profile in which a width of a cross section narrows from an upper side to a lower side, but is not limited thereto.

An insulating material may be used as a material of the first core insulating layer 111a. In this case, as the insulating material, an insulating material of copper clad laminated (CCL) may be used. An insulating material may be used as the material of the second and third core insulating layers 111b and 111c. In this case, as the insulating material, an insulating material of resin coated copper (RCC) may be used. However, the material of the first to third core insulating layers is not limited thereto, and separately, as the material of each of the first to third core insulating layers 111a, 111b, and 111c, a thermosetting resin such as an epoxy resin, a thermoplastic resin such as polyimide, or a resin impregnated into a core material such as glass fiber together with an inorganic filler, for example, prepreg, and the like may be used. When a material having high rigidity such as prepreg containing glass fiber or the like is used, it may be more effective in warpage control. The second and third core insulating layers 111b and 111c may include the same kind of material. The first core insulating layer 111a may have a thickness greater than those of the second and third core insulating layers 111b and 111c.

The first to fourth core wiring layers 112a, 112b, 112c, and 112d may include a metal material such as copper (Cu), aluminum (Al), silver (Ag), tin (Sn), gold (Au), nickel (Ni), lead (Pb), titanium (Ti), or alloys thereof. The first to fourth core wiring layers 112a, 112b, 112c, and 112d may perform various functions depending on designs. For example, the first to fourth core wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. Each of these patterns may be in the form of a line, a plane, or a pad. The first to fourth core wiring layers 112a, 112b, 112c, and 112d may be formed by a plating process such as an additive process (AP), a semi AP (SAP), a modified SAP (MSAP), or a tenting (TT), and may thus each include a seed layer, an electroless plating layer, and an electrolytic plating layer formed based on the seed layer. The first to fourth core wiring layers 112a, 112b, 112c, and 112d may further include copper foil as the lowest layer. Meanwhile, the first and second core wiring layers 112a and 112b may be formed based on the CCL and may thus have a copper foil layer as the lowest layer.

The first to third core via layers 113a, 113b, and 113c may penetrate through the first to third core insulating layers 111a, 111b, and 111c, respectively, and vertically connect the first to fourth core wiring layers 112a, 112b, 112c, and 112d. The first to third core via layers 113a, 113b, and 113c may also include a metal material such as copper (Cu), aluminum (Al), silver (Ag), tin (Sn), gold (Au), nickel (Ni), lead (Pb), titanium (Ti), or alloys thereof. The first to third core via layers 113a, 113b, and 113c may include signal connection vias, ground connection vias, and power connection vias, respectively, according to designs. The connection vias of each of the first to third core via layers 113a, 113b, and 113c may be completely filled with a metal material, or may also be formed of a metal material along a wall surface of a via hole. The first core via layer 113a may have an hourglass or cylindrical shape. The second and third core via layers 113b and 113c may have a tapered profile in opposite directions with the first core via layer 113a interposed therebetween. The first to third core via layers 113a, 113b, and 113c may also be formed by a plating process, for example, AP, SAP, MSAP, TT, or the like, and may thus include a seed layer, an electroless plating layer, and an electrolytic plating layer formed based on the seed layer. Meanwhile, the first core via layer 113a may be formed based on the CCL and may thus have a copper foil layer as the lowest layer. The connection vias of the first core via layer 113a may be integrated without boundaries with the pad patterns of the first and second core wiring layers 112a and 112b. The connection vias of each of the second and third core via layers 113b and 113c may be integrated with the pad patterns without boundaries with the pad patterns of each of the third and fourth core wiring layers 112c and 112d, respectively.

The stopper layer 115 may be disposed on the lower surface of the first core insulating layer 111a and covered with the second core insulating layer 111b. The stopper layer 115 may include the first metal layer 115a and the second metal layer 115b. The first metal layer 115a may be formed by the same plating process as that of the first core wiring layer 112a, for example, a process such as AP, SAP, MSAP, or TT, and may thus include a seed layer, an electroless plating layer, and an electrolytic plating layer formed based on the seed layer. The first metal layer 115a may further include copper foil as the lowest layer. The first metal layer 115a may be simultaneously formed by the same plating process as the first core wiring layer 112a and may be thus disposed at the same level as the first core wiring layer 112a. Therefore, the first metal layer 115a may include the same metal material, for example, copper (Cu) or the like, as the first core wiring layer 112a. The second metal layer 115b may be formed on the first metal layer 115a by the plating process described above. The second metal layer 115b may include a metal material different from the first metal layer 115a, for example, a metal material that may be selectively removed by different etching solutions. When the first metal layer 115a includes copper (Cu), the second metal layer 115b may include nickel (Ni), for example, without limitation. In plan view, the first metal layer 115a may have a ring shape formed to continuously surround the cavity 110H, and the second metal layer 115b may have a plane shape, for example, a rectangle or a square shape.

The electronic component 120 may be disposed in the cavity 110H. A back surface of the electronic component 120 may be attached to the stopper layer 115, for example, the second metal layer 115b through an adhesive 125 including a resin or an adhesive component such as an epoxy resin, for example, a die attach film (DAF). The electronic component 120 may be an integrated circuit (IC) providing in an amount of several hundreds to several millions of elements or more integrated in a single chip. For example, the electronic component 120 may be a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. For example, the electronic component 120 may also be a memory such as a volatile memory (for example, a DRAM), a non-volatile memory (for example, a ROM), a flash memory, or the like, or logic such as an analog-to-digital converter, an application-specific IC (ASIC), or the like. Meanwhile, the electronic component 120 may be a passive component in the form of a chip.

The electronic component 120 may be formed based on an active wafer. A base material of the body of the electronic component 120 may be silicon (Si), germanium (Ge), gallium arsenide (GaAs), or the like. Various circuits may be formed on the body. A connection pad 120P may be disposed on an active surface of the body. The connection pad 120P may electrically connect the electronic component 120 to other components. A material of the connection pad 120P may be a conductive material such as copper (Cu), aluminum (Al), or the like without particular limitation. A passivation film that covers at least a portion of the connection pad 120P and exposes at least a portion thereof may be disposed on the active surface of the body. The passivation film may be an oxide film or a nitride film, or a double layer thereof. An insulating layer, and the like, may be further disposed in appropriate positions. The electronic component 120 may be a bare die, but is not limited thereto, and may be a packaged die having a redistribution region.

The build-up structure 160 may include a first build-up insulating layer 130 covering at least a portion of each of the core structure 110 and the electronic component 120 and filling at least a portion of the cavity 110H, a first build-up wiring layer 132 disposed on the first build-up insulating layer 130, a second build-up insulating layer 140 disposed on the first build-up insulating layer 130 and covering at least a portion of the first build-up wiring layer 132, a second build-up wiring layer 142 disposed on the second build-up insulating layer 140, a third build-up insulating layer 150 disposed on the second build-up insulating layer 140 and covering at least a portion of the second build-up wiring layer 142, and a third build-up wiring layer 152 disposed on the third build-up insulating layer 150. The build-up structure 160 may further include a first build-up via layer 133 penetrating through the first build-up insulating layer 130 and connecting the first build-up wiring layer 132 to the connection pad 120P and the fourth core wiring layer 112d, a second build-up via layer 143 penetrating through the second build-up insulating layer 140 and connecting the first and second build-up wiring layers 132 and 142 to each other, and a third build-up via layer 153 penetrating through the third build-up insulating layer 150 and connecting the second and third build-up wiring layers 142 and 152 to each other.

The build-up structure 160 may allow more wiring designs in an upward direction. The build-up structure 160 may include the first to third build-up wiring layers 132, 142, and 152, and the first to third build-up via layers 133, 143, and 153, which can design various circuits and also provide upper and lower electrical connection paths. The build-up structure 160 may be configured with more layers than those illustrated in the drawing. However, the build-up structure 160 is not limited thereto, and may alternatively be configured with fewer layers than those illustrated in the drawing.

The first to third build-up insulating layers 130, 140, and 150 may be sequentially laminated on the core structure 110 and the electronic component 120. The first build-up insulating layer 130 may cover at least a portion of each of the core structure 110 and the electronic component 120. In addition, the first build-up insulating layer 130 may fill at least a portion of the cavity 110H. A material of each of the first to third build-up insulating layers 130, 140, and 150 is not particularly limited. For example, an insulating material may be used as the material of the first to third build-up insulating layers 130, 140, and 150. In this case, a thermosetting resin such as an epoxy resin, a thermoplastic resin such as polyimide, a resin in which the thermosetting resin and the thermoplastic resin are mixed with inorganic filler, for example, an Ajinomoto Build-up Film (ABF), or the like, may be used as the insulating material. The first to third build-up insulating layers 130, 140, and 150 may include the same kind of material as each other. Since the first to third build-up insulating layers 130, 140, and 150 are integrated after curing, it may be difficult to separate the boundaries by themselves.

The first to third build-up wiring layers 132, 142, and 152 may each include a metal material such as copper (Cu), aluminum (Al), silver (Ag), tin (Sn), gold (Au), nickel (Ni), lead (Pb), titanium (Ti), or alloys thereof. The first to third build-up wiring layers 132, 142, and 152 may also perform various functions depending on designs. For example, the first to third build-up wiring layers 132, 142, and 152 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. Each of these patterns may be in the form of a line, a plane, or a pad. The first to third build-up wiring layers 132, 142, and 152 may also be formed by a plating process, for example, AP, SAP, MSAP, TT, or the like, and may include a seed layer, an electroless plating layer, and an electrolytic plating layer formed based on the seed layer. The first to third build-up wiring layers 132, 142, and 152 may further include copper foil as the lowest layer.

The first to third build-up via layers 133, 143, and 153 penetrate through the first to third build-up insulating layers 130, 140, and 150, respectively. The first build-up via layer 133 may connect the first build-up wiring layer 132 to the connection pad 120P of the electronic component 120. In addition, the first build-up via layer 133 may connect the first build-up wiring layer 132 to the fourth core wiring layer 112d. The second and third build-up via layers 143 and 153 may vertically connect the first to third build-up wiring layers 132, 142, and 152 to each other. The first to third build-up via layers 133, 143, and 153 may also include a metal material such as copper (Cu), aluminum (Al), silver (Ag), tin (Sn), gold (Au), nickel (Ni), lead (Pb), titanium (Ti), or alloys thereof. The first to third build-up via layers 133, 143, and 153 may also include signal connection vias, ground connection vias, and power connection vias according to designs. The first to third build-up via layers 133, 143, and 153 may be completely filled with a metal material, or may be formed of a metal material along a wall surface of a via hole. The first to third build-up via layers 133, 143, and 153 may have a tapered profile in the same direction. For example, the first to third build-up via layers 133, 143, and 153 may have an upper width greater than a lower width on a cross section. The first to third build-up via layers 133, 143, and 153 may also be formed by a plating process, for example, AP, SAP, MSAP, TT, or the like, and may include a seed layer, an electroless plating layer, and an electrolytic plating layer formed based on the seed layer. The connection vias of each of the first to third build-up via layers 133, 143, and 153 may be integrated with the pad patterns without boundaries with the pad patterns of each of the first to third build-up wiring layers 132, 142, and 152.

The first passivation layer 170 may protect the third core wiring layer 112c from external physical or chemical damage. The first passivation layer 170 may be disposed on the lower surface of the second core insulating layer 111b to cover at least a portion of the third core wiring layer 112c, and have a plurality of first openings that expose at least a portion of the third core wiring layer 112c, respectively. A material of the first passivation layer 170 is not particularly limited. For example, an insulating material may be used as the material of the first passivation layer 170. In this case, a thermosetting resin such as an epoxy resin, a thermoplastic resin such as polyimide, a resin in which the thermosetting resin and the thermoplastic resin are mixed with inorganic filler, for example, an ABF, or the like, may be used as the insulating material. However, the material of the first passivation layer 170 is not limited, and a photosensitive insulating material such as solder resist (SR) may be used.

A second passivation layer 180 may protect the third build-up wiring layer 152 from external physical or chemical damage. The second passivation layer 180 may be disposed on the upper surface of the third build-up insulating layer 150 to cover at least a portion of the third build-up wiring layer 152, and have a plurality of second openings that expose at least a portion of the third build-up wiring layer 152, respectively. A material of the second passivation layer 180 is not particularly limited. For example, an insulating material may be used as the material of the second passivation layer 180. In this case, the ABF, the SR, or the like described above may be used as the insulating material. If desired, the second passivation layer 180 may include a different kind of material from the first passivation layer 170. For example, the second passivation layer 180 may have a smaller coefficient of thermal expansion (CTE). Thereby, a deviation in the coefficient of thermal expansion of the upper and lower portions of the substrate may be further improved.

First electrical connection metal bumps 190 may each be disposed in a respective one of the first openings of the first passivation layer 170. The first electrical connection metal bumps 190 may be each connected to the exposed third core wiring layer 112c. The first electrical connection metal bumps 190 may physically and/or electrically connect the electronic component embedded substrate 100 to the outside. For example, the electronic component embedded substrate 100 may be mounted on a main board of an electronic device or another ball grid array (BGA) substrate through the first electrical connection metal bumps 190. Each of the first electrical connection metal bumps 190 may be formed of tin (Sn) or an alloy including tin (Sn), for example, a solder, or the like. However, this is merely an example, and a material of each of the first electrical connection metal bumps 190 is not particularly limited thereto. Each of the first electrical connection metal bumps 190 may be a land, a ball, a pin, or the like. The first electrical connection metal bumps 190 may be formed as multiple layers or a single layer. When the first electrical connection metal bumps 190 are formed as the multiple layers, the first electrical connection metal bumps 190 may include a copper (Cu) pillar and a solder. When the first electrical connection metal bumps 190 are formed as the single layer, the first electrical connection metal bumps 190 may include a tin-silver solder or copper (Cu). However, this is merely an example, and the first electrical connection metal bumps 190 are not limited thereto. The number, interval, arrangement form, and the like, of first electrical connection metal bumps 190 are not particularly limited, and may be modified depending on design principles. If desired, an under bump metal (UBM) may be disposed on each of the plurality of first openings, and the first electrical connection metal bumps 190 may be each connected to the under bump metal.

Surface mounted components 210 may be further disposed on the second passivation layer 180. The surface mounted components 210 may be disposed on the second passivation layer 180 in the form of a surface mount through the second electrical connection metal bumps 220. The surface mounted components 210 may include active components and/or passive components. Examples of the active component may include the IC and the like described above with respect to the electronic component 120. Examples of the passive components may include a chip-type capacitor such as a multilayer ceramic capacitor (MLCC), a chip-type inductor such as a power inductor (PI), and the like. The second electrical connection metal bumps 220 may include tin (Sn) or an alloy including tin (Sn), for example, a solder or the like. If desired, a molding material covering the surface mounted component 210 may be further disposed on the second passivation layer 180. The molding material may be a known epoxy molding compound (EMC), but is not limited thereto. When the surface mounted components 210 are further disposed, the electronic component embedded substrate 100 may be utilized as SiP.

Meanwhile, the electronic component embedded substrate 100 according to an example may have a plurality of cavities 110H. In this case, the stopper layer 115 described above may be applied to each of the cavities 110H. The same or different electronic components may be disposed in each of the cavities 110H.

Figure 8:
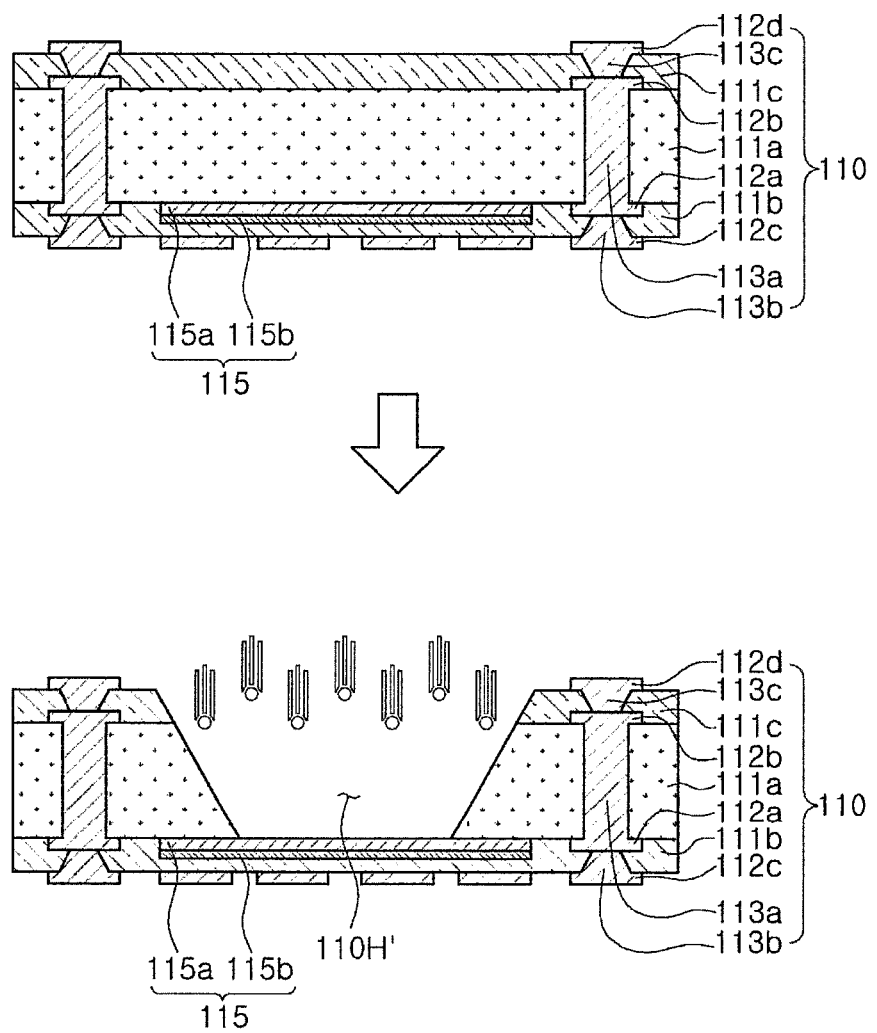
FIGS. 8 through 10 are schematic process views illustrating an example of manufacturing the electronic component embedded substrate of FIG. 3.
Figure 9:
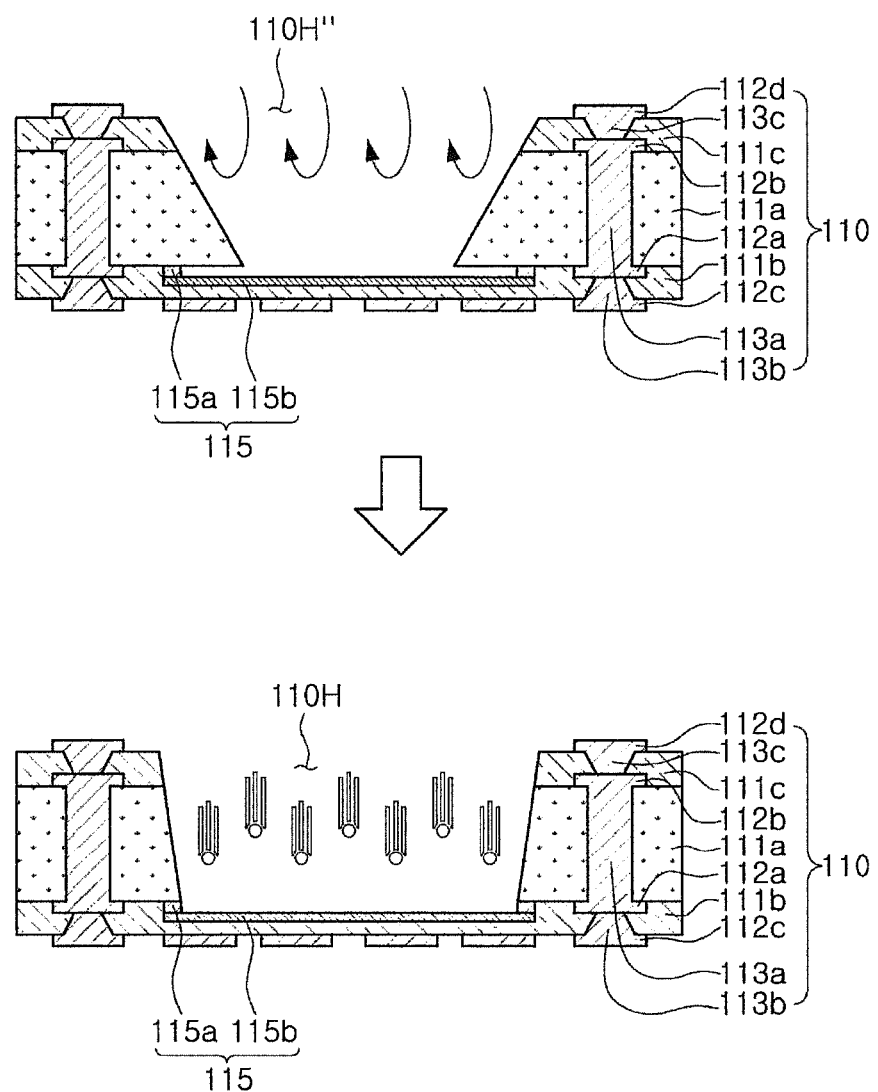
Figure 10:
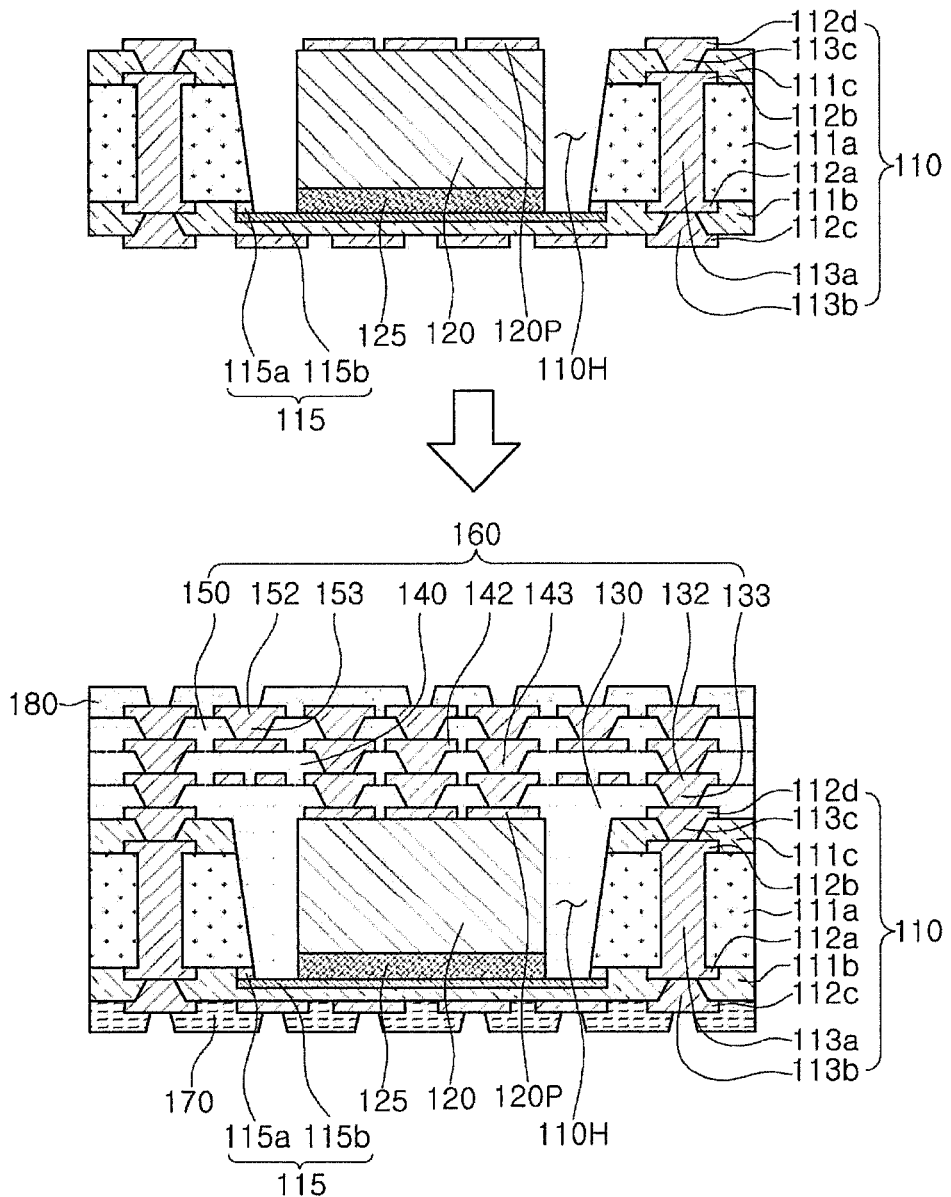

FIGS. 8 through 10 are schematic process views illustrating an example of manufacturing the electronic component embedded substrate of FIG. 3.

Referring to FIG. 8, first, a CCL or the like used as the first core insulating layer 111a is prepared. The CCL may be formed by laminating copper foil on the upper and lower surfaces of an insulating material. Next, via holes for the first core via layers 113a may be formed in the CCL using a mechanical drill or the like. Next, the first and second core wiring layers 112a and 112b and the first core via layer 113a may be formed by the plating process. In addition, the stopper layer 115 including the first metal layer 115a and the second metal layer 115b may be formed. Next, the second and third core insulating layers 111b and 111c may be formed by laminating prepregs on the upper and lower sides of the first core insulating layer 111a using RCC or the like. The RCC may be formed by laminating copper foil on the insulating material. In addition, via holes for the second and third core via layers 113b and 113c may be formed by laser processing or the like. Next, the third and fourth core wiring layers 112c and 112d and the second and third core via layers 113b and 113c may be formed by the plating process. If desired, a detach carrier film may be attached to a lower side of the core structure 110 manufactured through a series of processes with the first passivation layer 170 such as ABF interposed therebetween. Next, a patterned dry film may be attached to an upper side of the core structure 110 and a primary cavity 110H' having a depth to the first metal layer 115a may be formed through removal of the core insulating layers 111a and 111c by sand blast. In this case, a wall surface of the primary cavity (110H') may have an inclination of 50 to 65° similar to the general blind cavity.

Referring to FIG. 9, next, the patterned dry film or the like may be attached to the upper side, and the first metal layer 115a may be selectively removed using an etching solution for selectively etching the first metal layer 115a. As a result, a secondary cavity 110H" may be formed, and the surface of the second metal layer 115b may be exposed through the secondary cavity 110H". In addition, a foot having a protruding shape may be formed on a wall surface of the secondary cavity 110H". Next, a tertiary cavity 110H may be formed by attaching the patterned dry film to the upper side of the core structure 110 and removing the foot having the protruding shape by sand blast. In this case, the tertiary cavity 110H may be formed such that the protruding foot portion is removed to expose an inner surface of the first metal layer 115a. For example, in the process of forming the tertiary cavity 110H, the first metal layer 115a may serve as a guide and the second metal layer 115b may serve as a stopper. In this case, the wall surface of the tertiary cavity 110H may have a first inclination α1 close to the vertical at approximately 85° or more, and a second inclination α2 that is approximately 75° or more but smaller than the inclination α1.

Referring to FIG. 10, next, the electronic component 120 may be attached onto the stopper layer 115 in the cavity 110H in a face-up form using an adhesive 125. Next, the first build-up insulating layer 130 may be formed of an ABF laminate or the like. Next, the via hole may be formed by laser processing or the like, and the first build-up wiring layer 132 and the first build-up via layer 133 may be formed by a plating process. The second build-up insulating layer 140, the second build-up wiring layer 142, and the second build-up via layer 143 may be formed in a similar manner. In addition, the third build-up insulating layer 150, the third build-up wiring layer 152, and the third build-up via layer 153 may be formed in a similar manner. The build-up structure 160 may be formed through a series of processes. If desired, the second passivation layer 180 may be formed on an upper side of the build-up structure 160 by ABF lamination or SR coating and curing. The first passivation layer 170 may be formed at the same time or in advance in the previous operation as described above. The detach carrier film may be separated, and if desired, the first and second openings may be formed in the first and second passivation layers 170 and 180. In addition, if desired, the first and second electrical connection metal bumps 190 and 220 may be formed to mount the surface mounted components 210.

The electronic component embedded substrate 100 according to the above-described example may be manufactured through a series of processes, and other details are the same as described above, and thus detailed description thereof will be omitted.

Herein, a side portion, a side surface, and the like are used to refer to a left or right direction or a left or right surface with reference to the direction shown in the drawing for convenience; an upper side, an upper portion, an upper surface, and the like are used to refer to an upward direction or an upward surface with reference to the direction shown in the drawing for convenience; and a lower side, a lower portion, a lower surface, and the like are used to refer to a downward direction or a lower surface with reference to the direction shown in the drawing for convenience. In addition, a phrase "positioned at the side portion, the upper side, the upper portion, the lower side, or the lower portion" has been used as a concept including a case in which a target component is positioned in a corresponding direction, but does not directly contact a reference component, as well as a case in which the target component directly contacts the reference component in the corresponding direction. However, these directions are defined for convenience of explanation, and the claims are not particularly limited by the directions defined as described above, and the concept of the upper portion and the lower portion may be changed at any time.

The meaning of a "connection" of a component to another component in the present disclosure includes an indirect connection through an adhesive layer as well as a direct connection between two components. In addition, "electrically connected" means the concept including a physical connection and a physical disconnection. It can be understood that when an element is referred to with "first" and "second", the element is not limited thereby. The terms first, second, and the like may be used only for a purpose of distinguishing one element from other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein may be implemented by being combined in whole or in part one with another. For example, one element described in a particular exemplary embodiment, even if it is not described in another exemplary embodiment, may be understood as a description related to the other exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, the electronic component embedded substrate in which the foot size for embedding the electronic component may be reduced may be provided.

Further, the electronic component embedded substrate that may be modularized and miniaturized in the form of SiP may be provided.

While exemplary embodiments have been shown and described above, it will be apparent to those skilled in the art that modifications and variations could be made without departing from the scope of the present invention as defined by the appended claims.

What is claimed is:

1. An electronic component embedded substrate comprising:
    a core structure including a first insulating body and a plurality of core wiring layers respectively disposed on or in the first insulating body, the core structure having a cavity penetrating through at least a portion of the first insulating body in a thickness direction and having a stopper layer disposed on a lower side of the cavity; and an electronic component disposed in the cavity and attached to the stopper layer, wherein the stopper layer includes a first metal layer embedded in the first insulating body and having at least a portion of an inner surface exposed from the first insulating body, and a second metal layer disposed below the first metal layer and having at least a portion of an upper surface disposed as a bottom surface of the cavity to which the electronic component is attached, the cavity has the inner surface of the first metal layer and an inner surface of the first insulating body as a first wall surface and a second wall surface, respectively, and an inclination of the first wall surface and an inclination of the second wall surface are different from each other.

2. The electronic component embedded substrate of claim 1, wherein the inclination of the first wall surface is greater than the inclination of the second wall surface.

3. The electronic component embedded substrate of claim 1, wherein the first metal layer and the second metal layer include different metal materials.

4. The electronic component embedded substrate of claim 3, wherein the metal material of the first metal layer and the metal material of the second metal layer are removable using different etching solutions.

5. The electronic component embedded substrate of claim 3, wherein the first metal layer includes copper (Cu), and the second metal layer includes nickel (Ni).

6. The electronic component embedded substrate of claim 1, wherein the inner surface of the first metal layer continuously surrounds the cavity.

7. The electronic component embedded substrate of claim 1, wherein an upper surface of the first metal layer that contacts the first insulating body has a greater surface roughness than a lower surface of the first metal layer that contacts the second metal layer.

8. The electronic component embedded substrate of claim 1, wherein the first metal layer is disposed on a same level as one of the plurality of core wiring layers.

9. The electronic component embedded substrate of claim 1, wherein the stopper layer has a first region which includes the second metal layer and is exposed from the first insulating body by the cavity, and a second region which includes the first and second metal layers and is embedded in the first insulating body, and
 a thickness of the stopper layer in the first region is thinner than a thickness of the stopper layer in the second region.

10. The electronic component embedded substrate of claim 1, wherein the electronic component has a first surface on which a connection pad is disposed and a second surface opposite to the first surface, and
 the second surface is attached to the stopper layer through a die attach film (DAF).

11. The electronic component embedded substrate of claim 1, wherein the core structure includes a first core insulating layer, a first core wiring layer and the stopper layer each disposed on one surface of the first core insulating layer, a second core wiring layer disposed on another surface of the first core insulating layer, a second core insulating layer disposed on the first core insulating layer and covering at least a portion of each of the first core wiring layer and the stopper layer, a third core insulating layer disposed on the other surface of the first core insulating layer and covering at least a portion of the second core wiring layer, a third core wiring layer disposed on the second core insulating layer, a fourth core wiring layer disposed on the third core insulating layer, a first core via layer penetrating through the first core insulating layer and connecting the first and second core wiring layers to each other, a second core via layer penetrating through the second core insulating layer and connecting the first and third core wiring layers to each other, and a third core via layer penetrating through the third core insulating layer and connecting the second and fourth core wiring layers to each other, the first insulating body includes the first to third core insulating layers, the plurality of core wiring layers include the first to fourth core wiring layers, the first core insulating layer has a thickness greater than the thickness of each of the second and third core insulating layers, and the second and third core via layers have profiles tapered in opposite directions.

12. The electronic component embedded substrate of claim 1, further comprising a build-up structure including a second insulating body covering at least a portion each of the core structure and the electronic component and filling at least a portion of the cavity, and one or more build-up wiring layers each disposed on or in the second insulating body.

13. The electronic component embedded substrate of claim 12, wherein the build-up structure includes a first build-up insulating layer covering at least a portion of each of the core structure and the electronic component and filling at least a portion of the cavity, a first build-up wiring layer disposed on the first build-up insulating layer, and a first build-up via layer penetrating through the first build-up insulating layer and connecting the first build-up wiring layer to the electronic component and the plurality of core wiring layers, the second insulating body includes the first build-up insulating layer, the one or more build-up wiring layers include the first build-up wiring layer, and the first build-up via layer has a tapered profile in which a width of a cross section narrows in a direction toward the core structure.

14. The electronic component embedded substrate of claim 13, wherein the build-up structure further includes a second build-up insulating layer disposed on the first build-up insulating layer and covering at least a portion of the first build-up wiring layer, a second build-up wiring layer disposed on the second build-up insulating layer, and a second build-up via layer penetrating through the second build-up insulating layer and connecting the first and second build-up wiring layers to each other, the second insulating body further includes the second build-up insulating layer, the one or more build-up wiring layers further include the second build-up wiring layer, and the second build-up via layer has a tapered profile in which a width of a cross section narrows in the direction toward the core structure.

15. The electronic component embedded substrate of claim 12, further comprising:
 a first passivation layer disposed on a side of the core structure opposite to another side on which the build-up structure is disposed, the first passivation layer having a plurality of first openings exposing respective portions of any one of the plurality of core wiring layers; and a plurality of first electrical connection metal bumps each disposed on a respective one of the plurality of first openings, and each connected to at least a portion of the exposed core wiring layer.

16. The electronic component embedded substrate of claim 15, further comprising:
    a second passivation layer disposed on a side of the build-up structure opposite to another side on which the core structure is disposed, the second passivation layer having a plurality of second openings exposing respective portions of any one of the one or more build-up wiring layers;
    a plurality of second electrical connection metal bumps each disposed on a respective one of the plurality of second openings, and each connected to at least a portion of the exposed build-up wiring layer; and
    one or more surface mounted components mounted on the second passivation layer through the plurality of second electrical connection metal bumps.

17. An electronic component embedded substrate comprising:
    a core structure including a first insulating body and a plurality of core wiring layers respectively disposed on or in the first insulating body, the core structure having a cavity penetrating through at least a portion of the first insulating body in a thickness direction and having a stopper layer disposed on a lower side of the cavity,
    wherein the stopper layer includes first and second metal layers including different metal materials and overlapping each other in the thickness direction, the cavity penetrates through the first metal layer, and the cavity has the second metal layer integrally extending across a lower surface thereof, and
    a side wall surface of the first metal layer forms part of a side wall of the cavity, and an inclination of the side wall surface of the first metal layer is non-orthogonal to the lower surface of the cavity.

18. The electronic component embedded substrate of claim 17, wherein a side wall surface of the portion of the first insulating body forms another part of the side wall of the cavity, and an inclination of the side wall surface of the portion of the first insulating body is non-orthogonal to the lower surface of the cavity.

19. The electronic component embedded substrate of claim 18, the inclination of the side wall surface of the first metal layer is higher than the inclination of the side wall surface of the portion of the first insulating body.

20. The electronic component embedded substrate of claim 17, further comprising:
    an electronic component disposed in the cavity and attached to the second metal layer of the stopper layer; and
    a build-up structure including a second insulating body covering at least a portion each of the core structure and the electronic component and filling at least a portion of the cavity, and one or more build-up wiring layers each disposed on or in the second insulating body.

* * * * *